(12) United States Patent
Song

(10) Patent No.: US 6,366,113 B1
(45) Date of Patent: Apr. 2, 2002

(54) DATA RECEIVER

(75) Inventor: Ki-whan Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/716,557

(22) Filed: Nov. 20, 2000

(30) Foreign Application Priority Data

Jan. 6, 2000 (KR) ................................................ 00-522

(51) Int. Cl.[7] ....................... H03K 3/0233; H03K 3/037
(52) U.S. Cl. ........................... 326/24; 326/98; 365/203; 327/215
(58) Field of Search ............................ 326/24, 23, 25, 326/83, 81, 86, 95, 98; 327/333, 217, 215; 365/203

(56) References Cited

U.S. PATENT DOCUMENTS 5,995,434 A * 11/1999 Ryu .......................... 365/222
6,091,648 A * 7/2000 Furutani et al. ........ 365/189.11
RE36,932 E * 10/2000 Furutani ..................... 365/226

* cited by examiner

Primary Examiner—Michael Tokar
Assistant Examiner—Daniel D. Chang
(74) Attorney, Agent, or Firm—F. Chau & Associates, LLP

(57) ABSTRACT

A data receiver is provided for stabilizing a reference voltage to which input data is compared. The data receiver includes a differential amplification flip flop for comparing input data to a reference voltage in response to a clock signal, an amplifier for amplifying the results of the comparison, a latch for storing the logic level of the input data, and a counter coupling circuit for reducing the variation of the reference voltage caused by the operation of the differential amplification flip flop in response to an inverted clock signal. In the data receiver, the reference voltage is stably preserved without minimized variation. Also, there is substantially no consumption of direct current (DC) when the data receiver operates.

9 Claims, 5 Drawing Sheets

CLK FALLING
a : 0 → VDD−Vtn, $\Delta$a = VDD−Vtn
b : 0 → VREF−Vtn, $\Delta$b = VREF−Vtn CLK falling(/CLK rising)
c : VDD → VREF+|Vtp|, $\Delta$c=VREF+|Vtp|−VDD
d : VDD → Vtp, $\Delta$d=|Vtp|−VDD

DATA RECEIVER

BACKGROUND OF THE INVENTION

1. Field of the Invention

The present invention relates to semiconductor integrated circuits, and more particularly, to a device and method for stabilizing a reference voltage in a data receiver.

2. Description of Prior Art

An early description of data receiver circuits can be found in "A 2.6-GByte/s multipurpose Chip-to-Chip interface", by B. Lau et al., JSSC (November, 1998).

FIG. 1 shows a conventional data receiver 10 including first, second and third stages, 11, 12, and 13, respectively. The first stage 11 includes a comparator for comparing input data (DIN) with a reference voltage (VREF), the second stage 12 includes a sense amplifier flip-flop (SAFF) for sensing and amplifying the output of the first stage 11. The third stage 13 includes a latch such as an S-R latch, for latching the output of the second stage 12.

The comparator of the first stage 11 is enabled by a bias voltage BIAS to compare the input data (DIN) with the reference voltage (VREF). Thus, the reference voltage (VREF) needs to be stable, without fluctuation. The reference voltage (VREF) and the bias voltage BIAS have predetermined DC levels, and are provided by a typical voltage generator. The SAFF of the second stage 12 is enabled in response to a clock signal (CLK), to amplify the result of the comparison by the first stage 11. The third stage 13 stably latches the output of the second stage 12 using an S-R latch.

The reference voltage (VREF) needs to be stable, without fluctuation, within a level for the stable operation of the first stage 11. Accordingly, a voltage generator generates the reference voltage to have a constant voltage level. However, the reference voltage (VREF) fluctuates while being applied to the first stage. That is, when the comparator of the first stage is operated while a bias voltage BIAS is being applied, the level of the reference voltage (VREF) is caused to fluctuate by coupling capacitance on the VREF line, including a coupling capacitor between a reference voltage (VREF) line and the drain X of an NMOS transistor MN, and a coupling capacitor between the VREF line and the source Y of the NMOS transistor MN. The coupling capacitor, which is inevitably and parasitically generated during the manufacture of a transistor, denotes a capacitor between a gate and a drain or between a gate and a source.

The fluctuation of the level of the reference voltage (VREF) caused by the coupling capacitor is referred to as kick-back noise. Kick-back noise can be reduced by connecting a shunt capacitor between the reference voltage (VREF) line and a ground voltage VSS (not shown). The shunt capacitor is set to have a greater capacitance than the coupling capacitor, and reduces the kick-back noise which is generated on the VREF line by the coupling capacitor.

However, when the shunt capacitor is increased, a problem is generated in that the voltage bounce of the ground voltage VSS is strongly coupled to the reference voltage (VREF).

The fluctuation in the voltage level of the VREF line can degrade the operating speed or cause a malfunction when comparing VREF with the voltage of input data DIN.

Therefore, a need exists for a data receiver which operates stably by preventing the reference voltage (VREF) from fluctuating due to the bounce of a ground voltage, kick-back noise or the like.

SUMMARY OF THE INVENTION

One embodiment of the present invention provides a data receiver for receiving input data in response to a clock signal. The data receiver includes a receiver for comparing the input data to a reference voltage in response to the clock signal, amplifying the result of the comparison, storing the logic level of the input data, and a counter coupling circuit for moderating the variation of the reference voltage caused by the receiver in response to an inverted clock signal.

Preferably, the receiver includes a first and a second precharging unit for initializing the receiver to a power supply voltage in response to the inversion of the clock signal, and a comparator for comparing the input data to the reference voltage in response to the clock signal.

The comparator preferably includes a first and a second inverter, cross-coupled, connected to the precharging units, respectively, wherein the output of the first inverter is connected to the input of the second inverter while the input of the first inverter is connected to the output of the second inverter, a first and a second comparing transistor connected to the outputs of the inverters, respectively, and controlled by the input data and the reference voltage, respectively, and a switching transistor connected between the comparing transistors and a ground voltage, and controlled in response to the clock signal.

The counter coupling circuit, according to a preferred embodiment of the present invention, includes a first transistor having a source to which a power supply voltage is connected, the first transistor controlled in response to the inverted clock signal which is connected to the gate of the first transistor, a second transistor having a source connected to the drain of the first transistor, the second transistor controlled in response to the reference voltage which is connected to the gate of the second transistor, a third transistor of a diode type having a source which is connected to the drain of the second transistor, and a gate and a drain which are connected to each other, and a fourth transistor having a drain connected to the drain of the third transistor, and a source to which a power supply voltage is connected, the fourth transistor controlled by the inverted clock signal which is connected to the gate of the fourth transistor.

According to another embodiment of the present invention, a data receiver is provided for receiving input data in response to a clock signal. The data receiver includes a first and a second precharging unit for initializing the data receiver to the power supply voltage in response to an inverted clock signal. The data receiver further includes a first and a second inverter, cross-coupled, connected to the first and second precharging units respectively, wherein the output of the first inverter is connected to the input of the second inverter while the input of the first inverter is connected to the output of the second inverter. The data receiver also includes a first and a second comparing transistor connected to the outputs of the first and the second inverter respectively, and controlled by the input data and the reference voltage, respectively. Preferably, the data receiver includes a switching transistor which is connected between the comparing transistors and a ground voltage, and controlled in response to the clock signal. The data receiver also includes a first transistor having a source to which a power supply voltage is connected, the first transistor controlled in response to the inverted clock signal which is connected to the gate of the first transistor, a second transistor having a source connected to the drain of the first transistor, the second transistor controlled in response to the reference voltage which is connected to the gate of the second transistor, a third transistor of a diode type having a source which is connected to the drain of the second transistor, and a gate and a drain which are connected to each other, and a fourth transistor having a drain connected to the drain of the third transistor, and a source to which a power supply voltage is connected, the fourth transistor controlled by the inverted clock signal which is connected to the gate of the fourth transistor.

According to still another embodiment of the present invention a data receiver includes a differential amplification flip flop for comparing an input data to a reference voltage, a latch having a set terminal and a reset terminal for latching an output of the differential amplification flip flop, a counter coupling circuit, connected to the reference voltage, for moderating fluctuations in the width of the reference voltage by about 30%.

Preferably, the differential amplification flip flop includes a switching transistor for enabling a comparator in response to a clock signal, the comparator for comparing the input data to the reference voltage in response to the clock signal.

The counter coupling circuit, preferably includes four transistors, for moderating the reference voltage, sequentially connected between a power supply voltage and a ground, wherein the second transistor from the power supply, is controlled by a the reference voltage input of the comparator. The comparator includes a first comparing transistor for receiving the input data, and a second comparing transistor for receiving the moderated reference voltage.

BRIEF DESCRIPTION OF THE DRAWINGS

Preferred embodiments of the present invention will be described below in more detail, with reference to the accompanying drawings.

Like reference numerals appearing in separate drawings denote the same or similar elements.

DETAILED DESCRIPTION OF PREFERRED EMBODIMENTS

Figure 1:
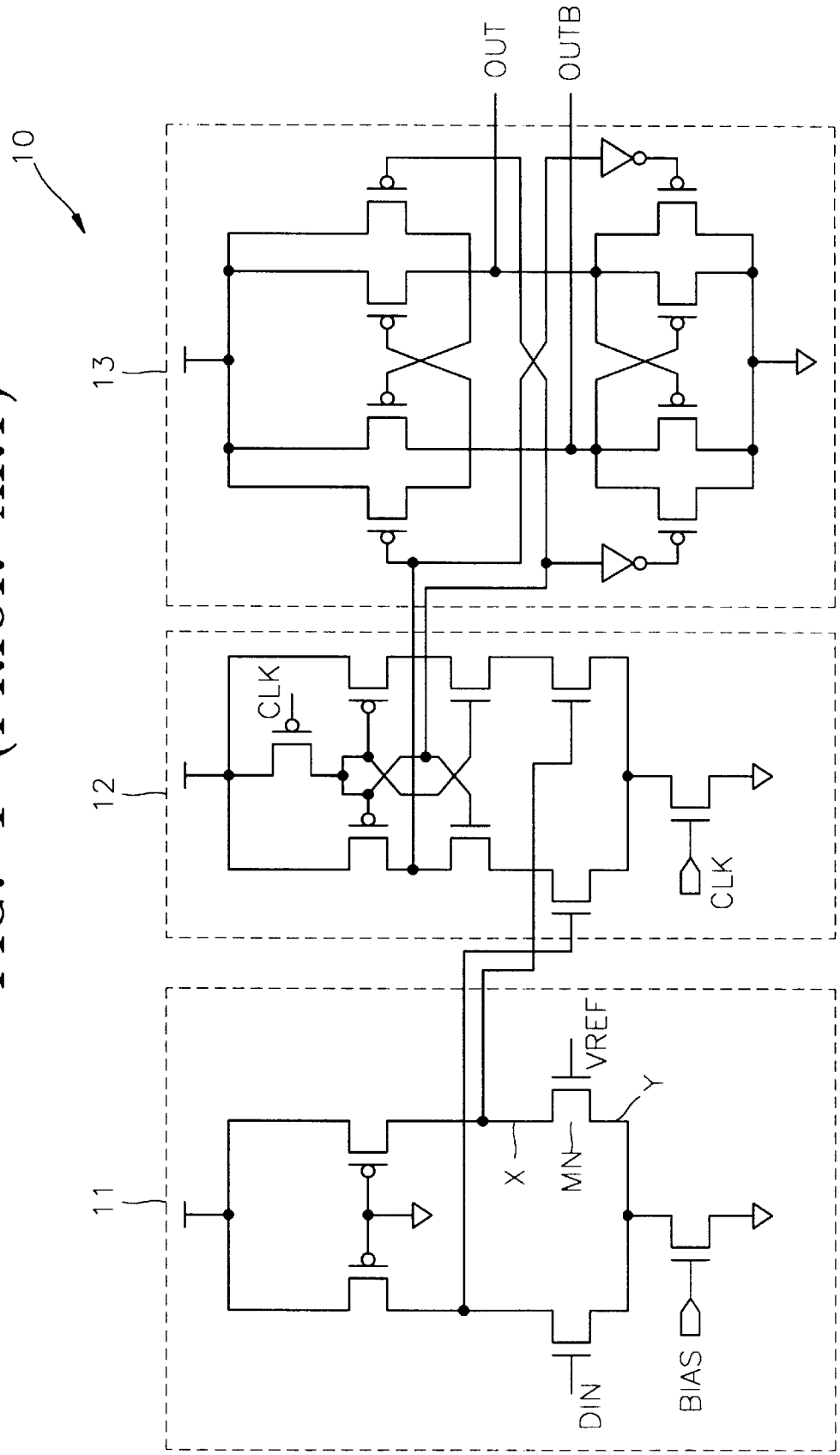
FIG. 1 shows a conventional data receiver.

The attached drawings illustrate preferred embodiments of the present invention, and are referred to in order to gain an understanding of the merits of the present invention, the operation thereof and the objectives accomplished by the operation of the present invention.

Hereinafter, the present invention will be described in detail by explaining preferred embodiments of the present invention with reference to the attached drawings. Like reference numerals reappearing in separate drawings denote the same members.

Figure 2:
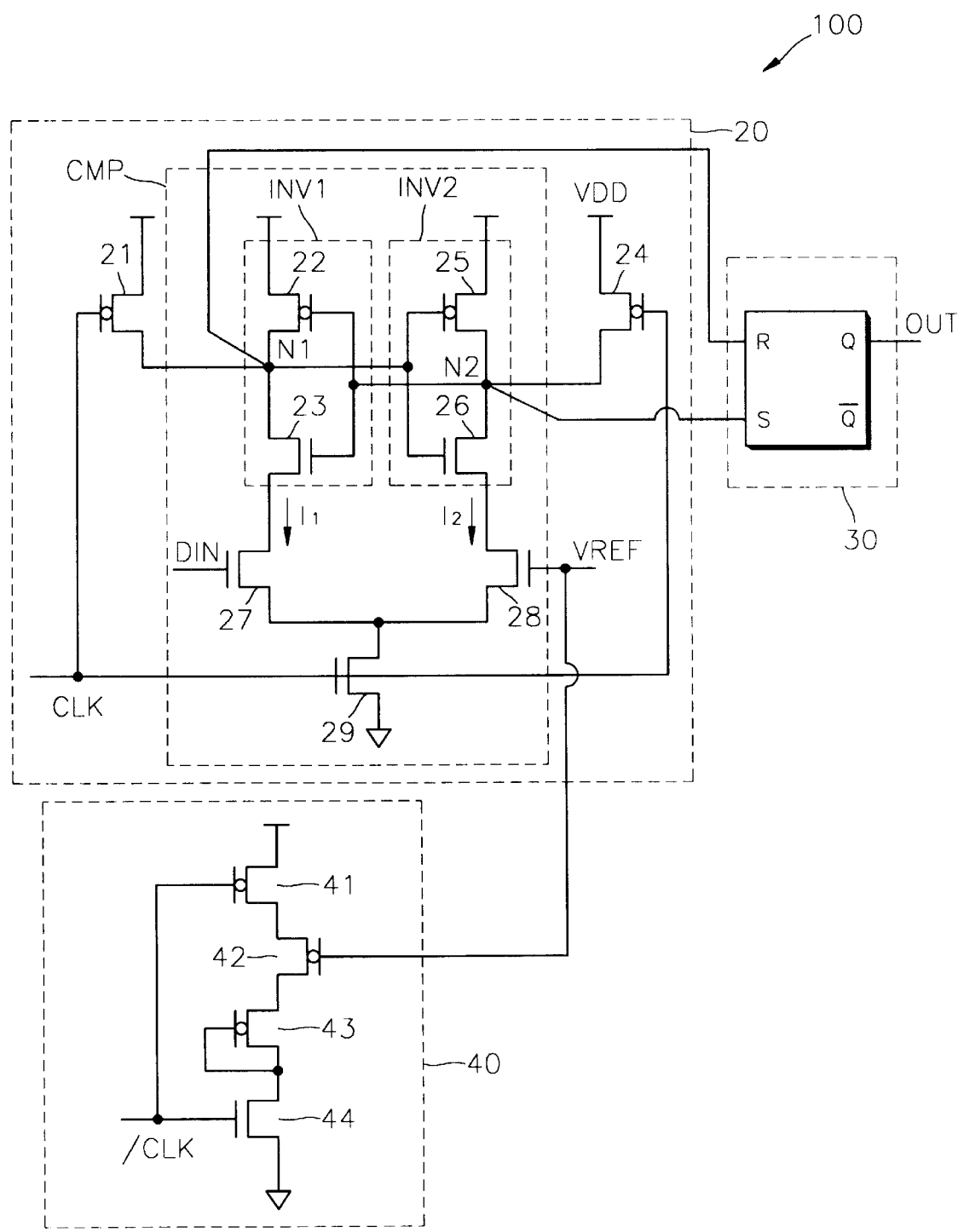
FIG. 2 shows a data receiver according to an embodiment of the present invention.

Referring to FIG. 2, which shows a data receiver according to an embodiment of the present invention, the data receiver 100 includes a differential amplification flip flop 20, an S-R latch 30 and a counter coupling circuit 40.

The differential amplification flip flop 20 compares input data, received in response to a clock signal (CLK), to a reference voltage (VREF). The differential amplification flip flop 20 includes first and second precharging units, 21 and 24 respectively. The first and second precharging units, (21 and 24) respond to the clock signal (CLK), and a comparator (CMP). The CMP includes cross-coupled inverters INV1 and INV2, which are connected to the first and second precharging units, 21 and 24 respectively. The cross-coupled inverters, INV1 and INV2, compare transistors 27 and 28, which are connected to the inverters INV1 and INV2 respectively. Transistors 27 and 28 are controlled by the input data (DIN) and the reference voltage (VREF), and a switching transistor 29 connected between the comparing transistors 27 and 28 and ground VSS. The switching transistor 29 is enabled in response to the clock signal (CLK).

In the operation of the S-R latch 30, when a logic high level is received by a set terminal S, the output signal (OUT) is set as a logic high level. When a logic high level is received by a reset terminal R, the output signal OUT is reset as a logic low level.

The counter coupling circuit 40 includes a first (PMOS) transistor 41, controlled in response to an inverted clock signal (/CLK), a second (PMOS) transistor 42, controlled in response to a reference voltage (VREF), a third (PMOS) transistor 43 of a diode type, and a fourth (NMOS) transistor 44, controlled in response to the inverted clock signal (/CLK). The first through fourth transistors, 41 through 44, are sequentially connected to each other between a power supply voltage (VDD) and a second ground VSS.

That is, the first (PMOS) transistor 41 has a source to which a power supply voltage is connected, and is controlled in response to an inverted clock signal connected to its' gate. The second (PMOS) transistor 42 has a source connected to the drain of the first transistor. The second (PMOS) transistor 42 is controlled in response to a reference voltage connected to its' gate. The third (PMOS) transistor 43, of a diode type, has a source which is connected to the drain of the second transistor, and a gate and a drain which are connected to each other. The fourth transistor 44 has a drain which is connected to the drain of the third transistor, and a source to which the second ground VSS is connected, and is controlled in response to the inverted clock signal connected to its gate.

The operation of the data receiver 100, based on the assumption that the voltage of the input data (DIN) is lower than the reference voltage (VREF), will now be described. The first and second precharging units 21 and 24 are turned on in response to the falling edge of a clock signal (CLK), so that nodes N1 and N2 are charged to the power supply voltage (VDD). At this time, the CMP does not operate since the switching transistor 29 within the CMP is in a turned-off state. Thereafter, the switching transistor 29 is turned on in response to the rising edge of the clock signal (CLK), so that the CMP is enabled. Since the voltage of the input data (DIN) is lower than the reference voltage (VREF), current $I_1$ flowing through the first comparing transistor 27 is less than the current $I_2$ flowing through the second comparing transistor 28.

That is, since the current $I_2$ flowing through the second comparing transistor 28 is relatively high, the voltage of the node N2 is reduced. The reduced voltage of the node N2 is received by the first cross-coupled inverter INV1 within the comparator (CMP), thus increasing the voltage level of the node N1. The increased voltage level of the node N1 is received by the second cross-coupled inverter INV2 within the CMP, further reducing the voltage level of the node N2. By repetition of these operations, the node N1 becomes a logic high level, and the node N2 becomes a logic low level.

The logic high level node N1 is received by the reset terminal R of the S-R latch 30, so that the output signal (OUT) is reset to a logic low level. The resetting of the output signal (OUT) conforms well with the assumption that the voltage level of the input data (DIN) is lower than the level of the reference voltage (VREF), so that the output of the data receiver 100 is a logic low level.

The operation of the data receiver 100, based on the assumption that the voltage of the input data (DIN) is higher than the reference voltage (VREF), will now be described. In this case, the current $I_1$ flowing through the first comparing transistor 27 is greater than the current $I_2$ flowing through the second comparing transistor 28. Thus, the voltage of the node N1 is reduced. The reduced voltage of the node N1 is received by the second cross-coupled inverter INV2 within the CMP, increasing the voltage of the node N2. The increased voltage of the node N2 is received by the first cross-coupled inverter INV1, further reducing the voltage of the node N1. By repetition of these operations, the node N1 becomes a logic low level, and the node N2 becomes a logic high level.

The logic high level node N2 is received by the set terminal S of the S-R latch 30, so that the output signal (OUT) is reset as a logic high level. The setting of the output signal (OUT) conforms well with the assumption that the voltage of the input data (DIN) is higher than the reference voltage (VREF), so that the output of the data receiver 100 is a logic high level.

As described above, the data receiver 100 can operate without a bias voltage BIAS, in contrast to the conventional data receiver 10 of FIG. 1, which is enabled by the bias voltage BIAS. Thus, there is no consumption of DC caused by the bias voltage BIAS in the case of the data receiver 100.

Figure 3:
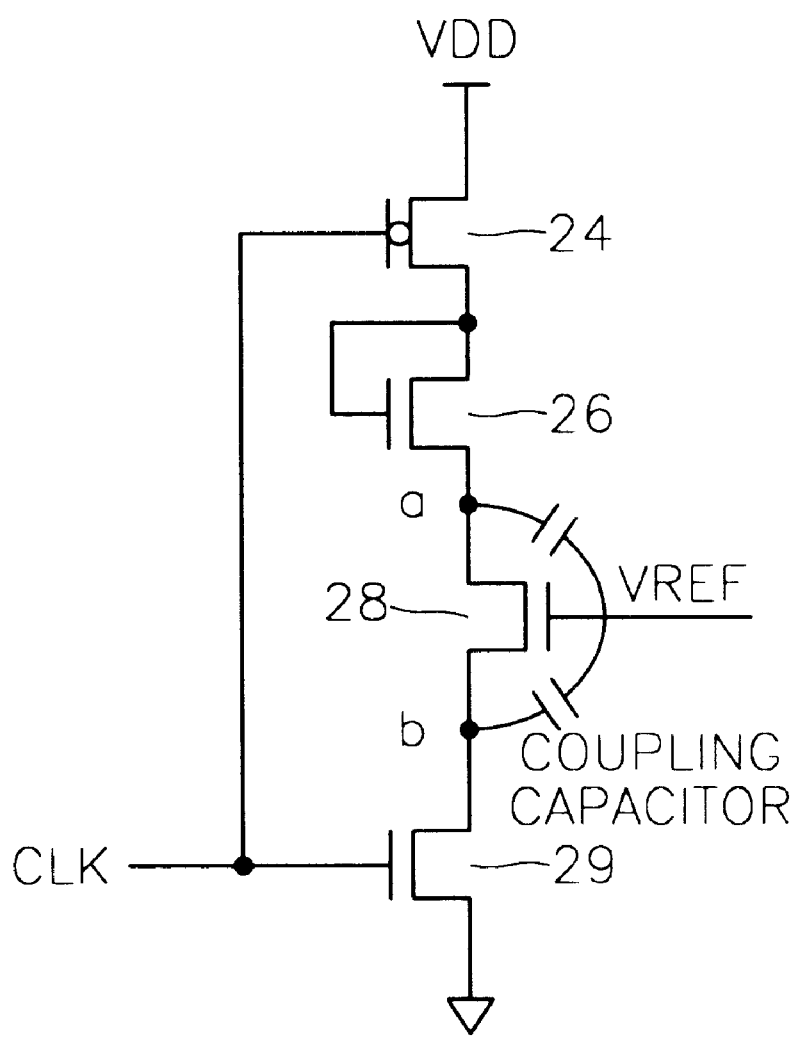
FIG. 3 is a circuit diagram illustrating coupling noise in the reference voltage of the differential amplification data receiver of FIG. 2.

FIG. 3 is a circuit diagram showing stray capacitance which causes kick-back noise on the reference voltage (VREF) line in the data receiver 100 of FIG. 2. Also, FIG. 3 shows an equivalent or modeled circuit path of the connection to the reference voltage (VREF) line at the falling edge of a clock signal (CLK). That is, FIG. 3 shows a path on which the second precharging unit 24, an NMOS transistor 26 within the second inverter INV2, the second comparing transistor 28, and the switching transistor 29 are connected to each other in series. Here, the NMOS transistor 26 within the second inverter INV2 is modeled as a diode type transistor in which its drain and gate are connected to each other since the nodes N1 and N2 of FIG. 2 have the same voltage at the falling edge of the clock signal (CLK) by the precharging units 21 and 24.

In the case of modeling the coupling path, a parasitic coupling capacitor exists between the gate and drain and between the gate and source of the second comparing transistor 28. The parasitic coupling capacitor causes fluctuation in the voltage of the VREF line. That is, the reference voltage (VREF) is coupled to a variation in the voltage levels of nodes a and b and thus fluctuates.

The voltage of the node a is changed from 0V at the beginning to a voltage (VDD−Vtn) obtained by subtracting the threshold voltage (Vtn) of the NMOS transistor 26 within the second inverter INV2 from the power supply voltage (VDD) at the falling edge of the clock signal (CLK). Accordingly, the voltage variation of the node a, Δa, is (VDD−Vtn)−0, that is, VDD−Vtn. The voltage of the node b is changed from 0V at the beginning to a voltage (VREF−Vtn) obtained by subtracting the threshold voltage (Vtn) of the comparing transistor 28 from the reference voltage (VREF), since the switching transistor 29 is turned off at the falling edge of the clock signal (CLK). Accordingly, the voltage variation of the node b, Δb, is (VREF−Vtn)−0, that is, VREF−Vtn.

Thus, the sum (Δa+Δb) of the voltage variations of the nodes a and b, that is, VDD+VREF−2Vtn, changes the voltage level of the reference voltage (VREF) through coupling capacitors. If VDD is 2.5V, VREF is 1.25V, and Vtn is 0.5V, the voltage variation sum (Δa+Δb) is 2.75V.

Figure 4:
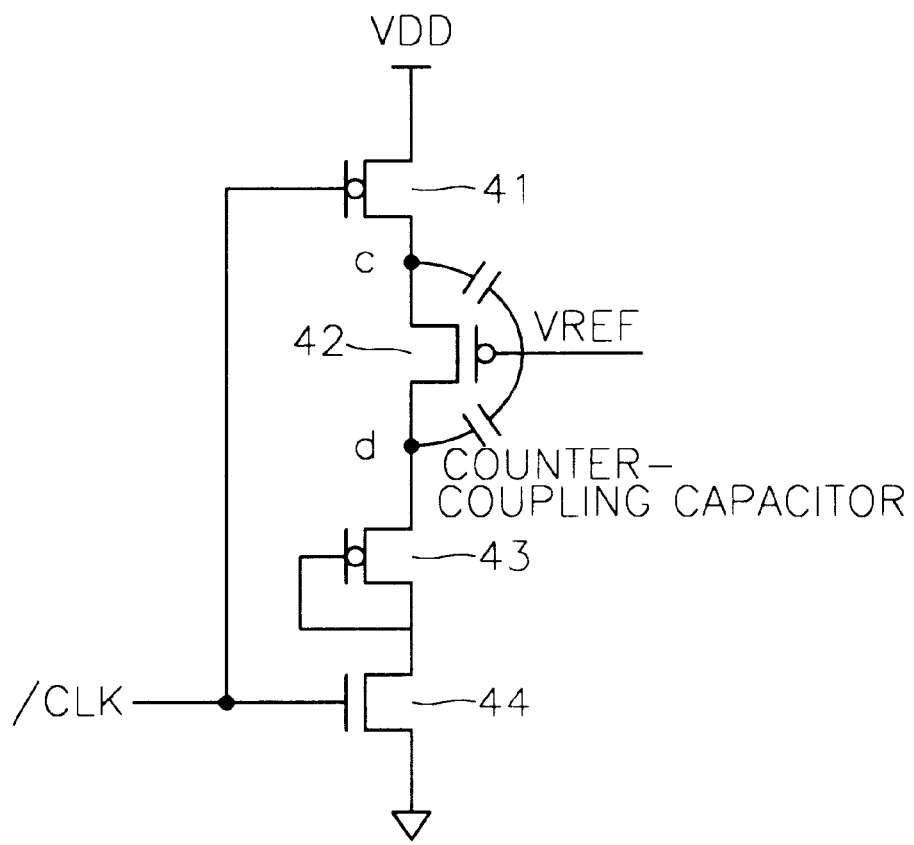
FIG. 4 is a diagram illustrating a modeled counter coupling circuit within the data receiver of FIG. 2.

FIG. 4 is an equivalent or modeled circuit diagram of a coupling path on which the variation of the reference voltage (VREF), shown by the model of FIG. 3, is compensated for by the counter coupling circuit 40. In the case of modeling the coupling path, a parasitic coupling capacitor exists between the gate and drain, and between the gate and source of the second PMOS transistor 42. The parasitic coupling capacitor causes fluctuation in the voltage of the (VREF) line, and offsets the variation of the reference voltage (VREF) shown in the modeling of FIG. 3.

The reference voltage (VREF) is coupled to the variation in the voltages of nodes c and d and thus fluctuates. The voltage of the node c is changed from the power supply voltage (VDD) at the beginning to a voltage (VREF+|Vtp|) obtained by adding the threshold voltage (Vtp) of the second PMOS transistor 42 to the reference voltage (VREF), since the first PMOS transistor is turned off at the falling edge of the clock signal (CLK). Accordingly, the voltage variation of the node c, Δc, is VREF+|Vtp|−VDD. The voltage of the node d is changed from the power supply voltage (VDD) at the beginning to the threshold voltage Vtp of the third PMOS transistor 43, since the fourth transistor 44 is turned on at the falling edge of the clock signal (CLK). Accordingly, the voltage variation of the node d, Δd, is |Vtp|−VDD.

Thus, the sum (Δc+Δd) of the voltage variations of the nodes c and d, that is, VREF+2|Vtp|−2VDD, changes the reference voltage (VREF) through the coupling capacitor. If VDD is 2.5V, VREF is 1.25V, and |Vtp| is 0.5V, the voltage variation sum (Δc+Δd) is −2.75V.

Hence, the voltage variation sum (Δa+Δb) of the nodes a and b, which changes the level of the reference voltage (VREF) as shown in the modeling of FIG. 3, 2.75V, offsets the voltage variation sum (Δc+Δd) of the nodes c and d, which changes the level of the reference voltage (VREF) as shown in the modeling performed by the counter coupling circuit of FIG. 4, −2.75V. The two voltage variations (Δa+Δb) and (Δc+Δd) offset each other, so that the reference voltage (VREF) is little changed.

Figure 5:
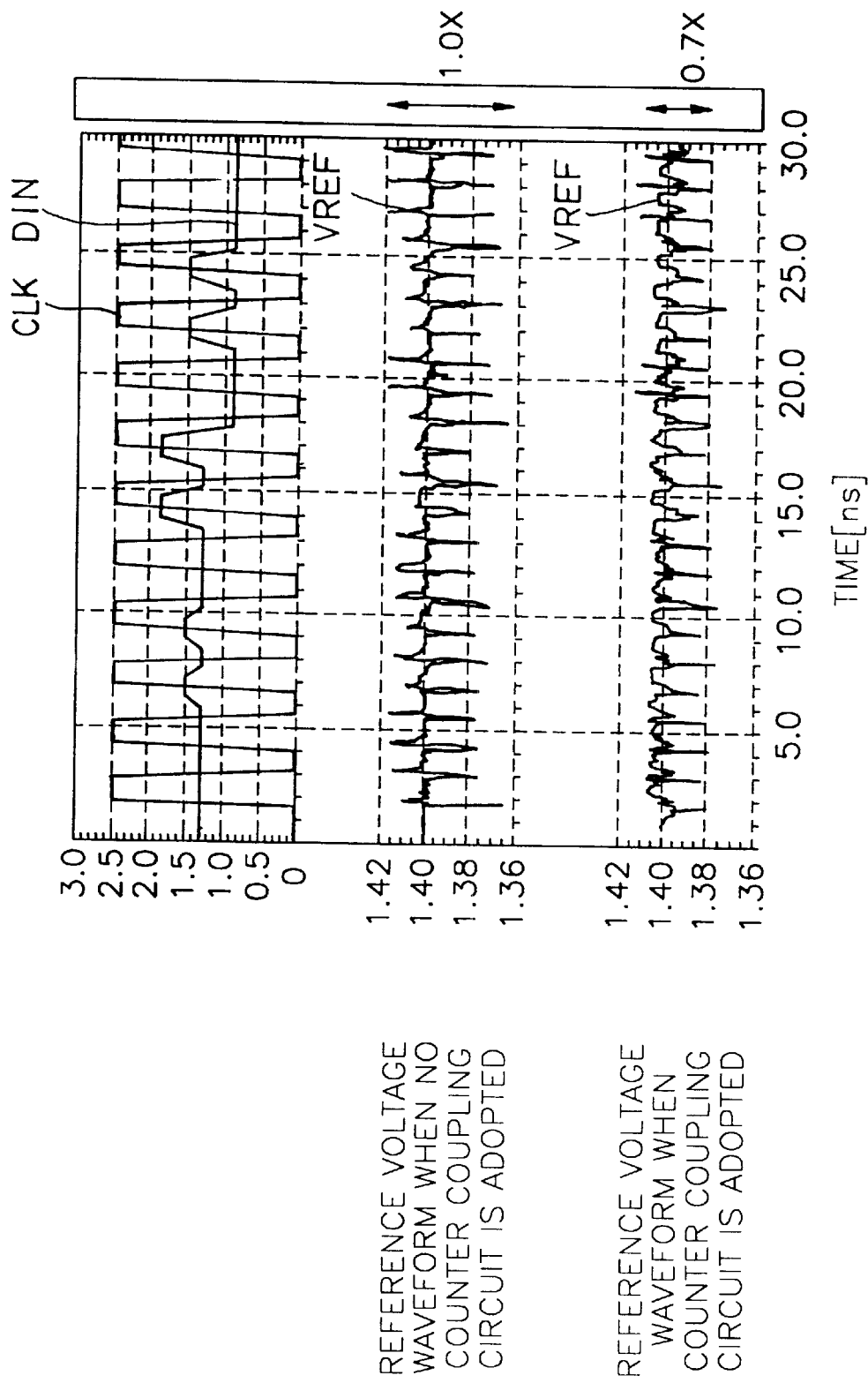
FIG. 5 is a graph showing the results of a simulation performed on the variation of a reference voltage (VREF) according to whether or not the data receiver of FIG. 2 is adopted.

Therefore, in a data receiver according to the present invention, the reference voltage is stably maintained without variation, so that input data (DIN) is compared to the correct reference voltage (VREF), and thus a corresponding logic level is output as the result of the comparison. FIG. 5 shows the results of a simulation performed on the variation of the reference voltage (VREF) when a counter coupling circuit is adopted by the data receiver according to the present invention, and when no counter coupling circuit is adopted by the data receiver according to the present invention.

In FIG. 5, input data (DIN) is received in synchronization with the clock signal (CLK), and the reference voltage (VREF) is set as 1.4V. It can be seen from FIG. 5 that, when no counter coupling circuit is adopted, the reference voltage (VREF) fluctuated from 1.36 V to 1.42 V at every edge of the clock signal (CLK). The fluctuation width is assigned an arbitrary value of 1.0.

On the other hand, when a counter coupling circuit is adopted, the reference voltage (VREF) fluctuated from 1.37 V to 1.41 V at every edge of the clock signal (CLK). Accordingly, the reference voltage (VREF) has a fluctuation width of about 0.7 compared to the arbitrarily-assigned fluctuation width of 1.0 when no counter coupling circuits are applied. Thus, it becomes evident that the fluctuation width of the reference voltage (VREF) when a counter coupling circuit is adopted is reduced by about 30% of the fluctuation width of the reference voltage (VREF) when no counter coupling circuit is adopted. The capacitance of the counter coupling circuit which is used is half of a simple shunt capacitance, and provides stability even upon the bounce of a ground voltage.

Although the invention has been described with reference to a particular embodiment thereof, it will be apparent to one of ordinary skill in the art that modifications of the described embodiment may be made without departing from the spirit and scope of the invention.

What is claimed is:

1. A data receiver for receiving input data in response to a clock signal, the data receiver comprising:
   a receiver for comparing the input data to a reference voltage in response to the clock signal, amplifying the result of the comparison, and storing the logic level of the input data; and
   a counter coupling circuit for compensating for a variation of the reference voltage caused by one or more transistors of the receiver in response to the clock signal.

2. The receiver of claim 1, wherein the counter coupling circuit comprises one or more transistors coupled to the reference voltage and responsive to an inverted version of the clock.

3. The receiver of claim 2, wherein the one or more transistors comprises:
   a first transistor having a source to which a power supply voltage is connected, the first transistor controlled in response to the inverted clock signal which is connected to the gate of the first transistor;
   a second transistor having a source connected to the drain of the first transistor, the second transistor controlled in response to the reference voltage which is connected to the gate of the second transistor;
   a third transistor of a diode type having a source which is connected to the drain of the second transistor, and a gate and a drain which are connected to each other; and
   a fourth transistor having a drain connected to the drain of the third transistor, and a source to which a power supply voltage is connected, the fourth transistor controlled by the inverted clock signal which is connected to the gate of the fourth transistor.

4. The receiver of claim 1, comprising:
   a first and a second precharging unit for initializing the receiver to a power supply voltage in response to the inversion of the clock signal; and
   a comparator for comparing the input data to the reference voltage in response to the clock signal.

5. The receiver of claim 2, wherein the comparator comprises:
   a first and a second inverter, cross-coupled, connected to the precharging units, respectively, wherein the output of the first inverter is connected to the input of the second inverter while the input of the first inverter is connected to the output of the second inverter;
   a first and a second comparing transistor connected to the outputs of the inverters, respectively, and controlled by the input data and the reference voltage, respectively; and
   a switching transistor connected between the comparing transistors and a ground voltage, and controlled in response to the clock signal.

6. A data receiver for receiving input data in response to a clock signal, the data receiver comprising:
   a first and a second precharging unit for initializing the data receiver to a power supply voltage in response to an inverted clock signal;
   a first and a second inverter, cross-coupled, connected to the first and second precharging units respectively, wherein the output of the first inverter is connected to the input of the second inverter while the input of the first inverter is connected to the output of the second inverter;
   a first and a second comparing transistor connected to the outputs of the first and the second inverter respectively, and controlled by the input data and the reference voltage, respectively;
   a switching transistor which is connected between the comparing transistors and a ground voltage, and controlled in response to the clock signal;
   a first transistor having a source to which a power supply voltage is connected, the first transistor controlled in response to the inverted clock signal which is connected to the gate of the first transistor;
   a second transistor having a source connected to the drain of the first transistor, the second transistor controlled in response to the reference voltage which is connected to the gate of the second transistor;
   a third transistor of a diode type having a source which is connected to the drain of the second transistor, and a gate and a drain which are connected to each other; and
   a fourth transistor having a drain connected to the drain of the third transistor, and a source to which a power supply voltage is connected, the fourth transistor controlled by the inverted clock signal which is connected to the gate of the fourth transistor.

7. The data receiver of claim 6, further comprising a latch having a set terminal and a reset terminal through which the outputs of the inverters are received, respectively, for storing the logic level of the input data.

8. A data receiver for receiving input data in response to a clock signal, the data receiver comprising:
   a receiver for comparing the input data to a reference voltage in response to the clock signal, and for latching the output of a comparator, the reference voltage being applied to a gate of an NMOS transistor, the reference voltage having voltage variation during activation of the NMOS transistor in response to the clock signal; and
   a counter coupling circuit having one or more MOS transistors wherein the reference voltage is applied to a PMOS transistor for compensating for the voltage variation during activation of the PMOS transistor in response to an inverted version of the clock signal.

9. The data receiver of claim 8, wherein the counter coupling circuit further includes a second PMOS transistor for coupling the PMOS transistor to a voltage supply, the inverted clock signal being applied to a gate of the second PMOS transistor.

* * * * *